United States Patent
Hurwitz et al.

(10) Patent No.: US 10,476,458 B2
(45) Date of Patent: Nov. 12, 2019

(54) METHOD OF AND APPARATUS FOR DETECTING OPEN CIRCUIT CONDITIONS AT AN INPUT TO A SIGNAL CHAIN AND FOR DETECTING CHANNEL IMBALANCE IN A DIFFERENTIAL SIGNAL CHAIN

(71) Applicant: Analog Devices Global Unlimited Company, Hamilton (BM)

(72) Inventors: Jonathan Ephraim David Hurwitz, Edinburgh (GB); Jesus Bonache, Valencia (ES); Robert Sythes, Portlaoise (IE); Eamonn J. Byrne, Mungret (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/969,242

(22) Filed: May 2, 2018

(65) Prior Publication Data
US 2019/0245500 A1    Aug. 8, 2019

(30) Foreign Application Priority Data
Feb. 7, 2018 (GB) .................................. 1801995.0

(51) Int. Cl.
*H03F 3/45* (2006.01)
(52) U.S. Cl.
CPC ... *H03F 3/45475* (2013.01); *H03F 2200/129* (2013.01); *H03F 2200/462* (2013.01); *H03F 2203/45526* (2013.01); *H03F 2203/45528* (2013.01); *H03F 2203/45594* (2013.01)
(58) Field of Classification Search
CPC ....................................................... H03F 3/45
USPC ....................................... 330/2, 69, 258, 259
See application file for complete search history.

(56) References Cited

U.S. PATENT DOCUMENTS

| | | | |
|---|---|---|---|
| 6,469,520 B1 | 10/2002 | Arguelles-paneda | |
| 7,053,712 B2 * | 5/2006 | Bonaccio | H03F 3/45183 330/253 |
| 7,636,015 B2 * | 12/2009 | Kurose | H03F 3/45183 330/253 |
| 7,642,852 B2 * | 1/2010 | Chandra | H03F 3/45183 330/258 |
| 7,746,171 B2 * | 6/2010 | Ali | H03F 3/45286 330/253 |
| 8,891,595 B1 | 11/2014 | Farjadrad et al. | |

(Continued)

FOREIGN PATENT DOCUMENTS

| | | |
|---|---|---|
| CA | 2255975 A1 | 3/2000 |
| EP | 2538626 A2 | 12/2012 |

OTHER PUBLICATIONS

Noro, Mutsumi, et al., "Common-Mode Noise Cancellation Circuit for Wearable ECG", (Apr. 20, 2017), 11 pgs.

(Continued)

*Primary Examiner* — Henry Choe
(74) *Attorney, Agent, or Firm* — Schwegman Lundberg & Woessner, P.A.

(57) ABSTRACT

It is often desirable to distinguish between an open circuit condition and a no signal condition. In both cases an input signal may be absent, but only one of these events represents a failure of the equipment. The present disclosure provides a way to use a difference amplifier to check for open circuit events, without requiring additional circuitry at the input of the amplifier.

20 Claims, 10 Drawing Sheets

(56) References Cited

U.S. PATENT DOCUMENTS

| | | | |
|---|---|---|---|
| 2005/0151588 A1* | 7/2005 | Bailey | H03F 3/45659 330/253 |
| 2007/0096817 A1* | 5/2007 | Sutardja | H03F 1/08 330/253 |
| 2008/0030273 A1* | 2/2008 | Gopinathan | H03F 3/45659 330/258 |
| 2008/0100308 A1 | 5/2008 | Crick | |

OTHER PUBLICATIONS

"European Application Serial No. 19155971.5, Extended European Search Report dated Jun. 11, 2019", 8 pgs.

* cited by examiner

METHOD OF AND APPARATUS FOR DETECTING OPEN CIRCUIT CONDITIONS AT AN INPUT TO A SIGNAL CHAIN AND FOR DETECTING CHANNEL IMBALANCE IN A DIFFERENTIAL SIGNAL CHAIN

CLAIM OF PRIORITY

This U.S. patent application claims priority to GB Patent Application No. 1801995.0, filed on Feb. 27, 2018, which is hereby incorporated by reference in its entirety for all purposes.

FIELD

The present disclosure relates to method of and apparatus for electrical or other signal processing.

BACKGROUND

There are many circumstances where a transducer may be located remotely from an apparatus which is responsive to the signal from the transducer. The interconnection between the transducer and the signal processing apparatus may be made by way of a conductor, such as a wire, which may interface with plugs and sockets in order that the circuit may be made. Such an arrangement may be susceptible to damage, by way of physical shock causing the cable to become broken, thermal cycling or vibratory movements causing the insulation to become damaged or corrosion of the pins making the connections between the transducer and the measuring apparatus.

SUMMARY OF THE DISCLOSURE

The present inventors have recognized, among other things, that it is desirable to be able to distinguish between failure of the connection and situations where the output of the transducer is low or non-existent. In each case, it can be seen that a signal that is being looked for would be largely absent.

The present disclosure relates to a method of and an apparatus for detecting an out-of-range impedance, such as a higher than expected impedance condition, at an input to a signal processing apparatus. The condition may be indicative of failure of a connection between the signal processing apparatus and an input circuit whose impedance is broadly known, at least within a specified range of values. More generally, the teachings herein can be used to detect an impedance change in both increasing and decreasing directions of change. The teachings of the present disclosure may also be used to identify channel imbalance within a differential signal processing system, such as a differential amplifier. Such identification can be used to address the imbalance by adjusting component values within the differential system. According to a first aspect of the present disclosure there is provided a method of detecting channel imbalance in a circuit that comprises a differential signal processing circuit. The method comprises modifying a common mode voltage at signal nodes which are distinct from the input nodes of the differential signal processing circuit, and monitoring a differential signal at the signal nodes to look for changes in the differential signal at the signal nodes that are correlated with changes in the common mode signal.

The magnitude and/or phase of the correlation is indicative of the degree of channel imbalance. This can be used to infer sensor failure, open circuit conditions and short circuit conditions.

The differential signal processing circuit may comprise a difference amplifier or some other circuit configuration where the current flowing into differential input nodes can be influenced by changing a common mode voltage or current at the signal nodes, where the signal nodes are not the differential input nodes. In an embodiment where the differential signal processing circuit comprises a difference amplifier, the signal nodes can be the differential output nodes of the difference amplifier.

The difference amplifier can include a common mode output control pin. Thus, if the amplifier is configured as a voltage amplifier, then a signal at the common mode control pin can be used to set a common mode output voltage at the output nodes of the difference amplifier. Thus, in this example, the difference amplifier is embodied as a dual ended differential amplifier.

It is thus possible to provide a method of detecting channel imbalance in a circuit that comprises a differential amplifier, the method comprising modulating a common mode voltage at the output of the amplifier and monitoring a differential output voltage for changes in the differential output voltage that are correlated with changes in the common mode voltage at the output. Detection of channel imbalance can be used to detect an open circuit condition of other failure mode.

According to a second aspect of the present disclosure there is provided an apparatus for detecting channel imbalance in a differential signal processing system having a node for controlling a common mode value of the differential output signal, the apparatus comprising common mode output modulation means for modulating a common mode component of the differential output signal and processing means for examining a correlation between a differential output signal and the common mode modulation so as to identify channel imbalance.

Components extending between the nodes carrying the differential output signal and nodes to which differential input nodes are connected cause the modulation of the common mode output voltage to modulate a current or voltage at the input nodes. Channel imbalance, such as differences in the impedances connected to the inverting and non-inverting input nodes of the differential signal processing system, causes the modulation of the common mode output voltage to be translated to a modulation of the differential output voltage.

In an example, the differential signal processing system comprises a differential dual ended amplifier.

According to a third aspect of the present disclosure there is provided an open circuit detector, comprising a first input node, a second input node, a difference amplifier, and a signal generator providing a time varying signal for adjusting a common mode voltage of the difference amplifier such that the input current at the first input node becomes modulated in response to the reference signal, and a circuit for detecting when a response of the amplifier to the common mode change exceeds a threshold, the reference signal being applied to a node other than the first input node.

BRIEF DESCRIPTION OF THE DRAWINGS

Embodiments of the present disclosure will now be described, by way of non-limiting example only, with reference to the accompanying Figures in which.

DESCRIPTION OF SOME EMBODIMENTS

Figure 1:
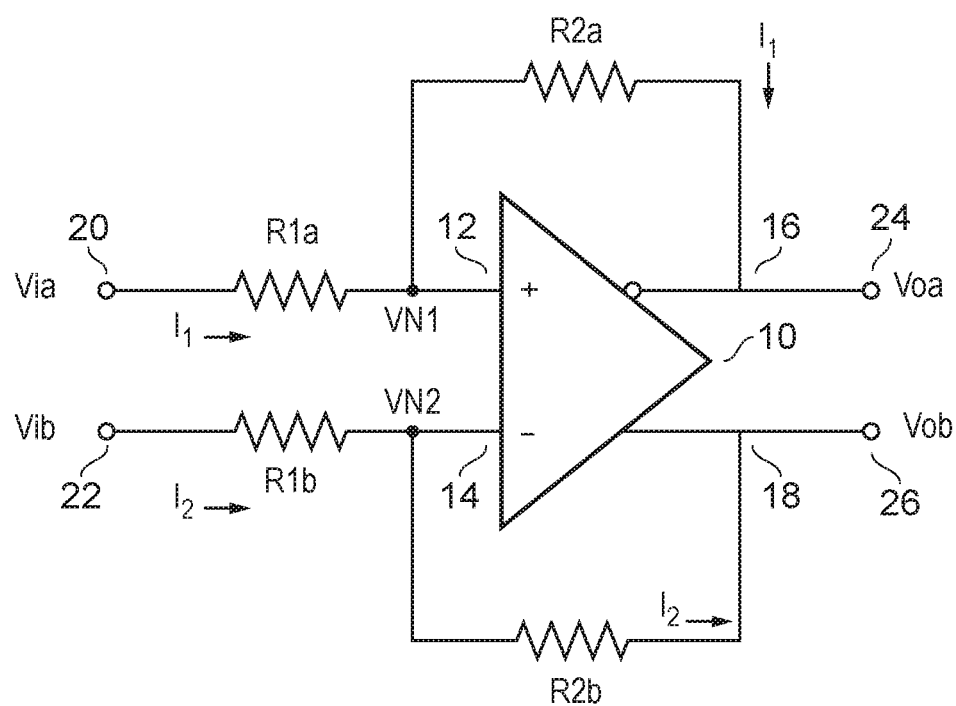
FIG. 1 is a circuit diagram of an amplifier, where the amplifier has a dual ended (differential) output and the gain (which also includes the possibility of attenuation) of the amplifier is set by resistors $R_1$ and $R_2$.

In signal amplification and instrumentation, difference amplifiers can be used at an input stage for processing analog signals from transducers. FIG. 1 schematically illustrates a circuit diagram of a common difference amplifier configuration, i.e. a differential amplifier having a differential or dual ended output, rather than a single ended output. In the arrangement shown in FIG. 1, the difference amplifier, generally designated 10, has a non-inverting input 12 and an inverting input 14. It also has an inverting output 16 and a non-inverting output 18. The amplifier receives signals via first and second input nodes 20 and 22, which can be regarded as non-inverting and inverting input nodes respectively, and provides a differential output to output nodes 24 and 26 which can be regarded as inverted and non-inverted outputs, respectively.

Gain equations can be established for the operation of a single ended differential amplifier. A dual ended amplifier is shown in FIG. 1. If the circuit components are selected such that the input resistor $R_{1a}$ is equal to the input resistor $R_{1b}$ ($R_{1a}=R_{1b}=R_1$) and that feedback resistor $R_{2a}$ is equal to feedback resistor $R_{2b}$ ($R_{2a}=R_{2b}=R_2$), as is commonly the case, then the differential gain of that circuit is $$\frac{-R_2}{R_1}.$$

Figure 2:
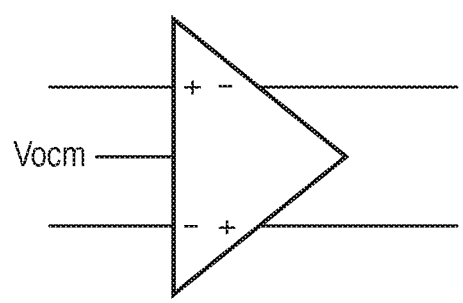
FIG. 2 shows a circuit symbol of a dual ended differential amplifier with common mode output voltage control.
Figure 3:
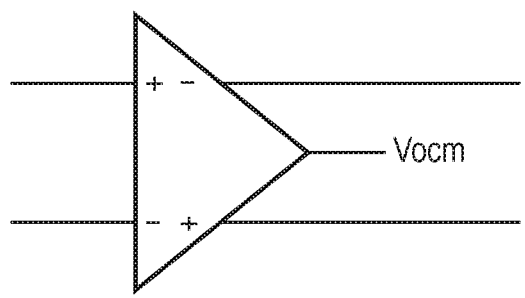
FIG. 3 shows a further circuit symbol of a dual ended differential amplifier with a common mode output voltage control.

In certain amplifiers, a the common mode voltage can be set via a control terminal. Circuit symbols of such amplifiers are shown in FIGS. 2 and 3.

Figure 4:
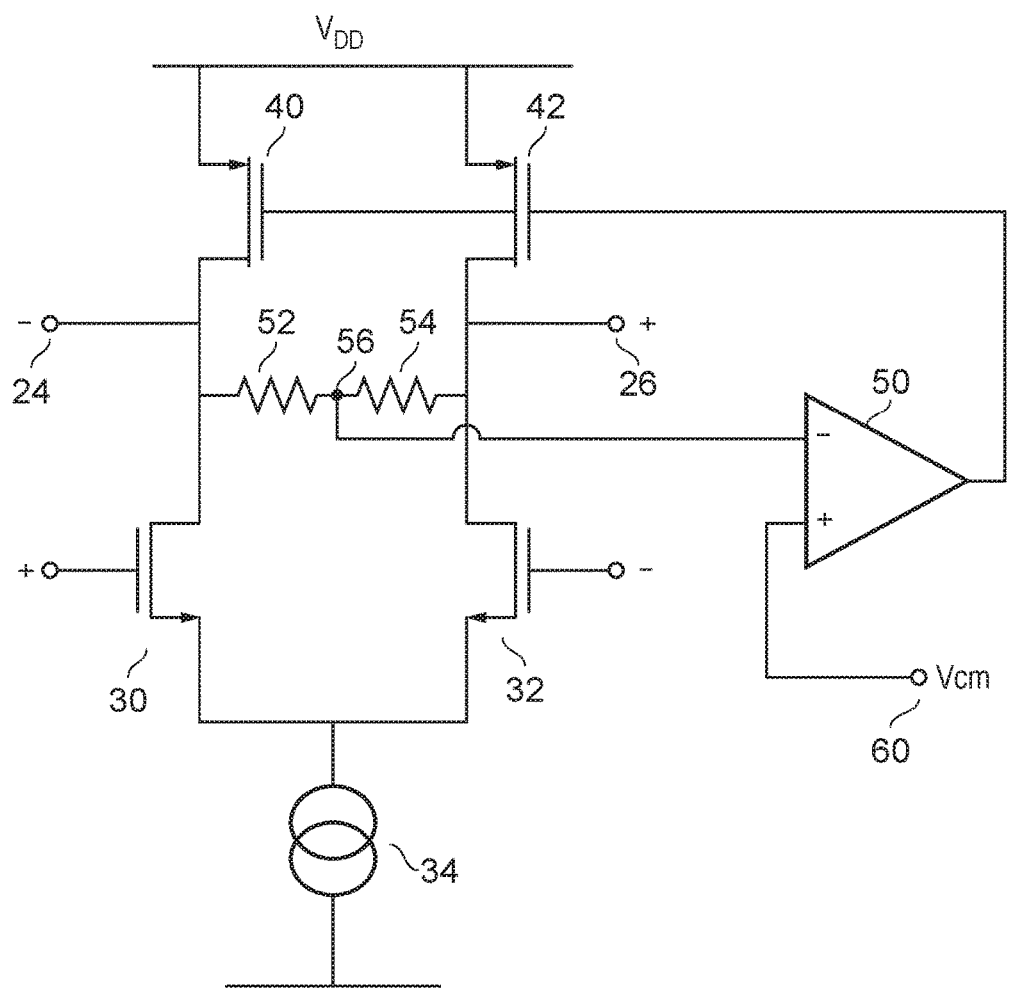
FIG. 4 schematically illustrates, merely by way of general background information, an embodiment of an amplifier having common mode voltage control.

Whilst the construction of such an amplifier need not be detailed in the teachings of the present disclosure, save for the fact that some of the embodiments of the disclosure use such a device, a simplified circuit diagram for a differential amplifier having differential outputs and the ability to set the common mode value of the outputs to a target value is shown in FIG. 4.

The differential amplifier shown in FIG. 4 comprises first and second input transistors 30 and 32 with their sources connected to a current sink 34, thereby forming the well-known long-tail pair configuration. The drains of the transistors 30 and 32 are connected to the positive supply rail Vdd by way of P-type FETs 40 and 42 which serve to form active loads, and whose gates are connected so as to receive a control voltage from a further differential amplifier 50 provided within the amplifier circuit for the purposes of controlling the common mode output voltage. The differential output voltage can be obtained at nodes 24 and 26 connected to the drains of the first and second transistors 30 and 32, respectively.

In order to provide the common mode voltage control function the circuit further includes a voltage divider comprising resistors 52 and 54 extending between the drains of the first and second transistors 30 and 32 so as to form the common mode output voltage at an internal node 56. The internal node 56 is connected to the inverting input of the further differential amplifier 50. The non-inverting input of the further differential amplifier 50 is connected to the common mode adjustment pin 60 which receives a common mode target voltage $V_{cm}$. The output of the further differential amplifier 50 provides the gate voltage for the load transistors 40 and 42. Such an arrangement provides a differential amplifier whose common mode voltage can be adjusted. Integrated circuits, such as the AD8137 available from Analog Devices can include this capability. The AD8137 dates from 2004.

The present inventors realized, among other things, that the ability to modulate the common mode output voltage could be exploited to look for impedance imbalance within the input path to a difference amplifier, and that this can be used both to improve the common mode rejection ratio of such an amplifier and/or look for fault conditions such as disconnection of a signal path from a transducer or other input arrangement to a differential amplifier.

Returning to FIG. 1, we can perform an analysis to indicate how modification of the common mode output voltage can be used to interrogate the common mode rejection performance of the amplifier and/or to look for disconnection in signal paths to the input nodes 20 and 22.

Given that the current at the inputs of an operational amplifier is very low, we can write the input currents at the input nodes in terms of the circuit voltage.

$$I_1 = \frac{V_{ia} - V_{oa}}{R_{1a} + R_{2a}}$$

$$I_2 = \frac{V_{ib} - V_{ob}}{R_{1b} + R_{2b}}$$

We can express the output voltages $V_{oa}$ and $V_{ob}$ as a combination of a common mode voltage and $V_{cm}$ and a differential voltage $V_{od}$ where $V_{oa}-V_{ob}=2V_{od}$.

For simplicity, let's assume $$R_{1a} = R_{1b} = R_1$$
$$R_{2a} = R_{2b} = R_2$$

$$\therefore I_1 = \frac{V_{ia} - V_{cm} - V_{od}}{R_1 + R_2}$$

$$I_2 = \frac{V_{ib} - V_{cm} + V_{od}}{R_1 + R_2}$$

If we further make the assumption that $V_{ia}$ and $V_{ib}$ have been connected to a reference node, such as 0V, then we also know that the differential component $V_{od}$ will be zero.

$$\therefore I_1 = \frac{-V_{cm}}{R_1 + R_2}$$

$$I_2 = \frac{-V_{cm}}{R_1 + R_2}$$

This demonstrates that one can adjust the current drawn at the input of the amplifier by adjusting the common mode output voltage.

Put another way, one has a tool to deliberately modulate the current drawn by the amplifier, without requiring any additional circuitry at the input of the amplifier, and in so doing can examine the properties of the input circuitry.

Figure 5:
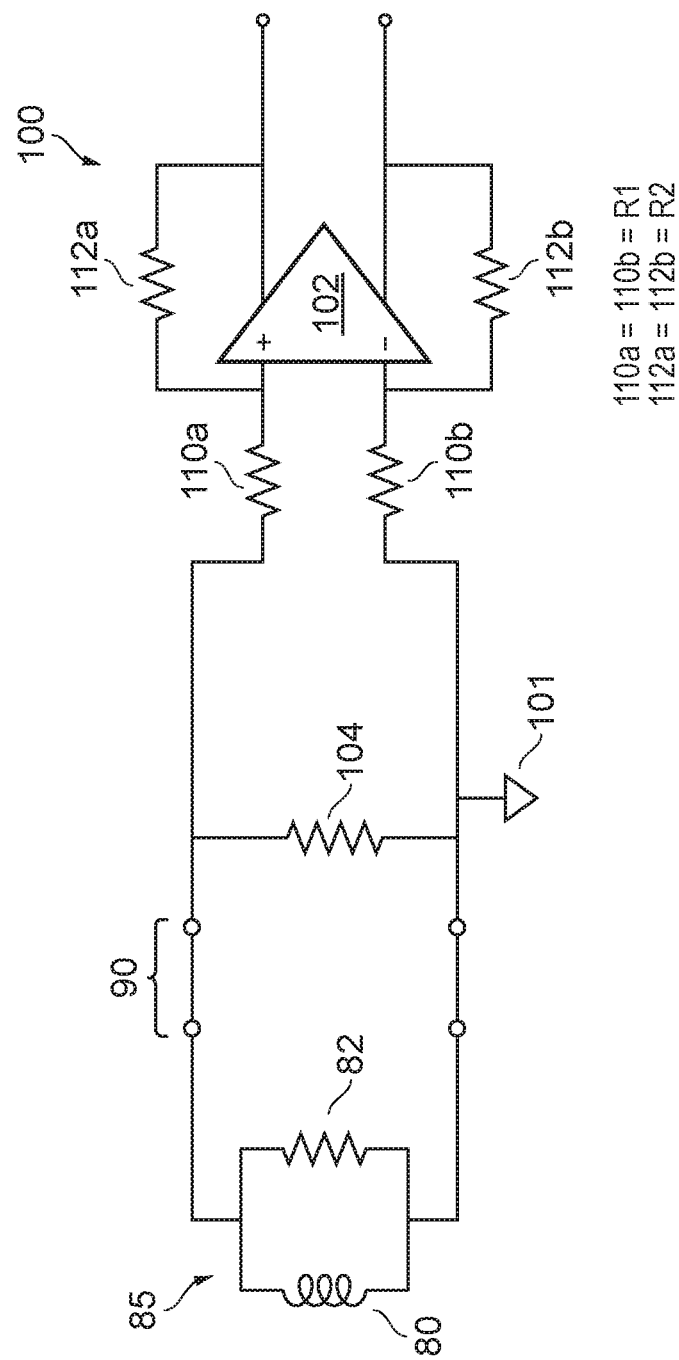
FIG. 5 schematically illustrates a measurement circuit that is used to amplify the output of a transducer.

FIG. 5 schematically illustrates the use of a difference amplifier 100 to receive and amplify a differential signal from a magnetic transducer, such as a current transformer or a Rogowski coil. The magnetic coil of the current transformer 80 is connected across a burden resistor 82 in order to transform the induced current therein into the voltage domain (in the case of a Rogowski coil which is typically a low impedance the burden resistor is typically omitted). The current transducer 80 and burden resistor 82 effectively form an input circuit 85. The input circuit is connected to the difference amplifier 100 by way of a conductor 90 which may extend over quite some distance. If the conductor 90 becomes broken then no input signal can be received at the difference amplifier 100. However, it also transpires that if no alternating current is being drawn by a conductor near the coil of the current transformer 80, then there is little or no signal received at the difference amplifier 100 even though the intervening conductor 90 is intact.

A further consideration in such circuits is that in the event of the conductor 90 becoming broken the circuit designer does not want either the inverting or non-inverting input of the difference amplifier left floating. In order to address this, a ground connection 101 is made adjacent the input stage of the amplifier and a high value resistor 104 is connected between the non-inverting and inverting inputs. If the conductor 90 becomes broken then both of the inputs of the amplifier are connected to ground. In the example shown in FIG. 5 the non-inverting input is connected to ground 101 by way of the input resistor 100a in series with the impedance 104. The non-inverting input is connected to ground by way of the input resistor 110b. If the conductor 90 is connected and intact, then the resistors 82 and 104 and the impedance of the current transformer appear in parallel. For simplicity we shall assume that the resistance of the parallel combination of the impedance of the current transformer and the burden resistor can be represented solely by the burden resistor. In a typical installation the resistor 82 is many times smaller in value than the resistor 104 and hence the parallel combination of the resistors 82 and 104 is effectively the same value as resistor 82. In general, although not of strict necessity, one may choose to tend to set the resistors such that the resistor 110a is the same value as resistor 110b. Similarly the feedback resistors 112a and 112b are set to the same value. For convenience later on, it will be assumed that the resistors 110a and 110b have a value $R_1$ and resistors 112a and 112b have a value $R_2$.

Figure 6:
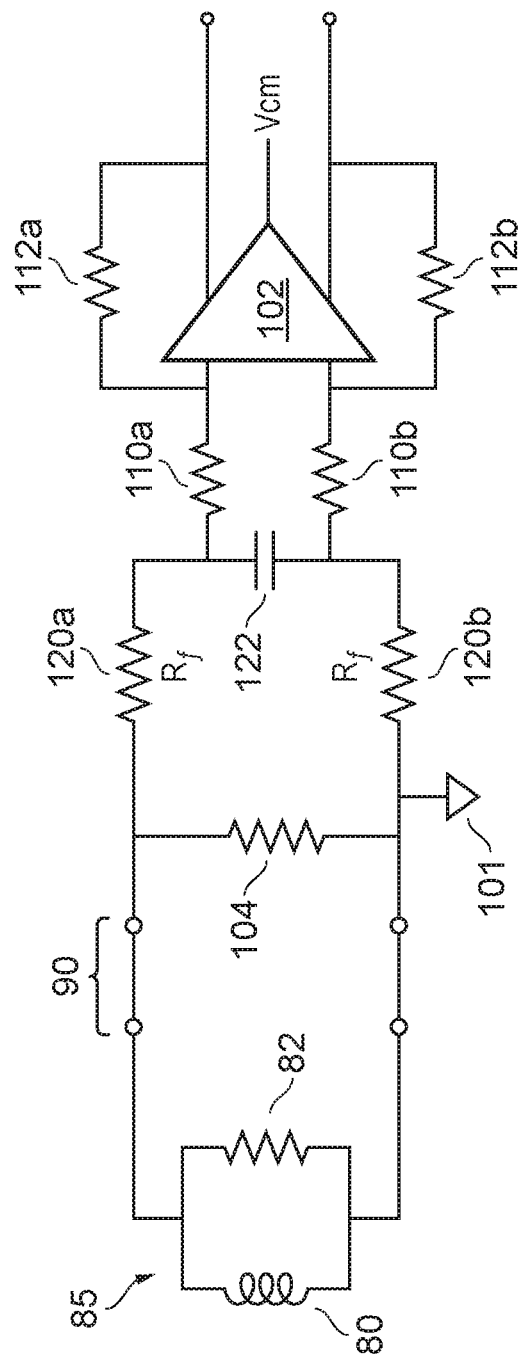
FIG. 6 shows a modification of FIG. 5 with the inclusion of a low pass (anti-aliasing) filter.

The circuit configuration of FIG. 5 is often modified by the inclusion of a low pass filter, which serves as an anti-aliasing filter, at the input of the amplifier. In FIG. 6 the anti-aliasing filter is formed by resistors 120a, 120b and capacitor 122. The resistor 120a is interposed in series with the resistor 110a and the connector 90. The resistor 120b is interposed between the resistor 104 and the resistor 110b.

The capacitor 122 extends between a first node formed at the junction between the resistors 120a and 110a and a second node formed at the connection between resistors 120b and 110b. The resistors 120a and 120b have the same value, generally, and in this circuit diagram have the value Rf.

The amplifier in FIG. 6 also has a common mode setting terminal to receive a control signal such that the common mode value of the output of the amplifier is $V_{cm}$, being the same as the voltage supplied at the common mode voltage setting terminal of the amplifier.

In this configuration it can be seen that a change in differential output voltage can be related to the common mode output voltage by the following equation:

$$V_o = \frac{2R_2 R_{pd} V_{cm}}{2R_1^2 + (2R_1 + 2R_f + R_{pd})R_2 + 2R_1(2R_f + R_{pd}) + 2R_f^2 + 2R_f R_{pd}}$$

in this equation the resistor 104 has the value $R_{pd}$.

If the connection to the input transducer is intact then the resistance $R_{pd}$ becomes replaced by the impedance of the input transducer, e.g. the parallel combination of the current transformer and burden resistor. In a low frequency regime this impendence is essentially that of the burden resistor 82, which is typically 100 ohms or so.

It therefore follows that modulating the common mode output voltage gives a change in the differential output voltage, where the magnitude of that change depends on whether the input transducer 85 is connected to the differential amplifier or not. Consequently the magnitude of the change in the differential voltage can be examined and used to indicate failure of a connector 90, and more specifically to distinguish between situations where the transducer is working correctly and is connected to the amplifier but there is no signal to the output, and those situations where the connector 90 has failed.

Merely by way of example
if R1=1 MΩ
R2=400 KΩ
Rf=30 KΩ
Rpd=100 KΩ
then $$\frac{dV_o}{dV_{cm}} = -25_m \text{V/V}$$

but if conductor 90 is working then $R_{pd}$ becomes shorted by $R_B$, then the burden resistor, of approximately 100Ω, then $$\frac{dV_o}{dV_{cm}} = -25_\mu \text{V/V}$$

Figure 7:
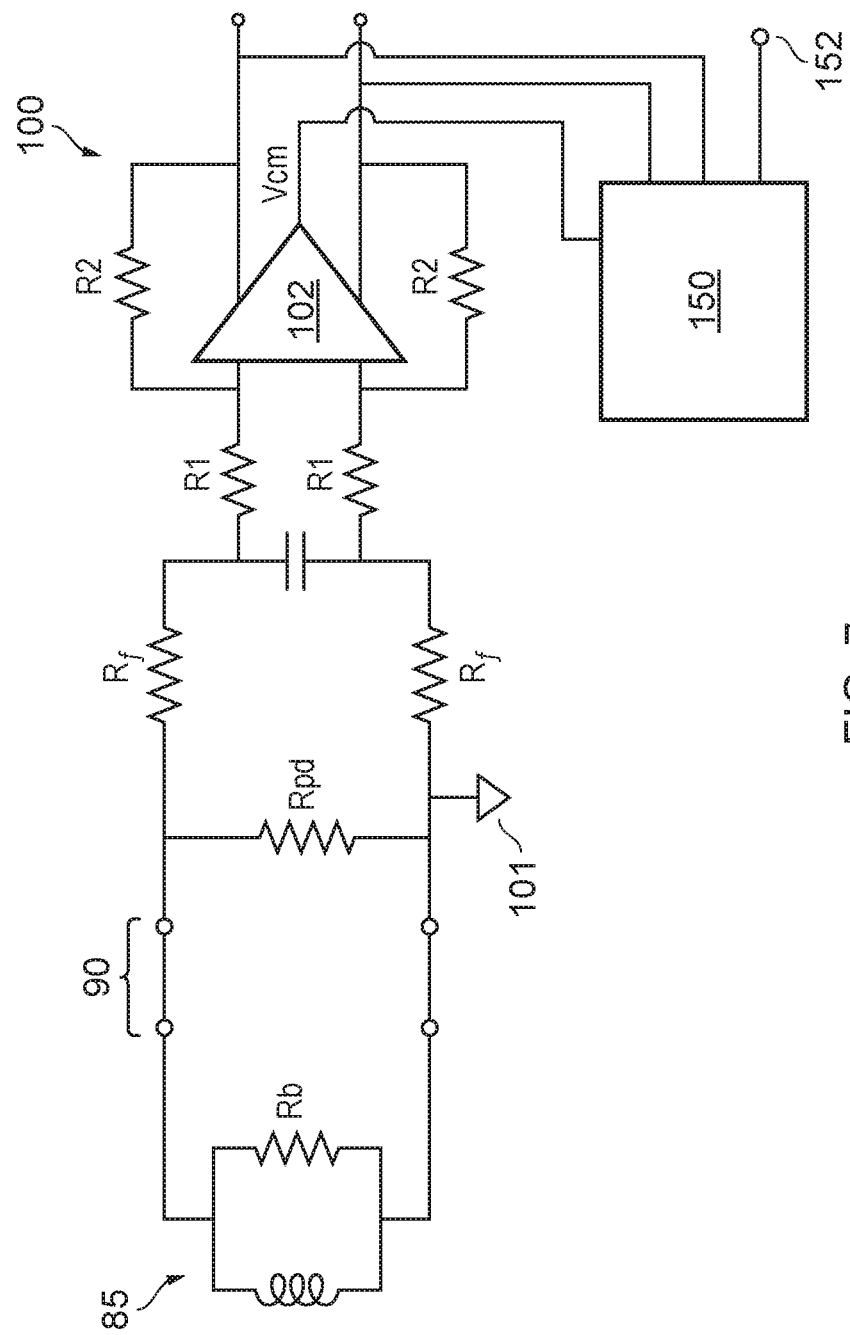
FIG. 7 illustrates how the circuit of FIG. 6 can be modified to include input mismatch and/or an open circuit detection capability.

FIG. 7 schematically shows the circuit of FIG. 6 with the addition of a data processor (including analog to digital converters and digital to analog converters) 150 which is operable to monitor the differential output of the amplifier and, if necessary, to modulate or otherwise vary the target common mode output voltage $V_{cm}$. The processing circuit 150 can be implemented in various forms, such as dedicated digital hardware, dedicated analog hardware, a mixed mode solution or by the reuse of processors and analog to digital converters and digital to analog converters that may have been provided to perform other tasks and which have spare capacity or can be repurposed. The status of the connection 90, i.e. good or failed can be output as a signal at node 152.

Figure 8:
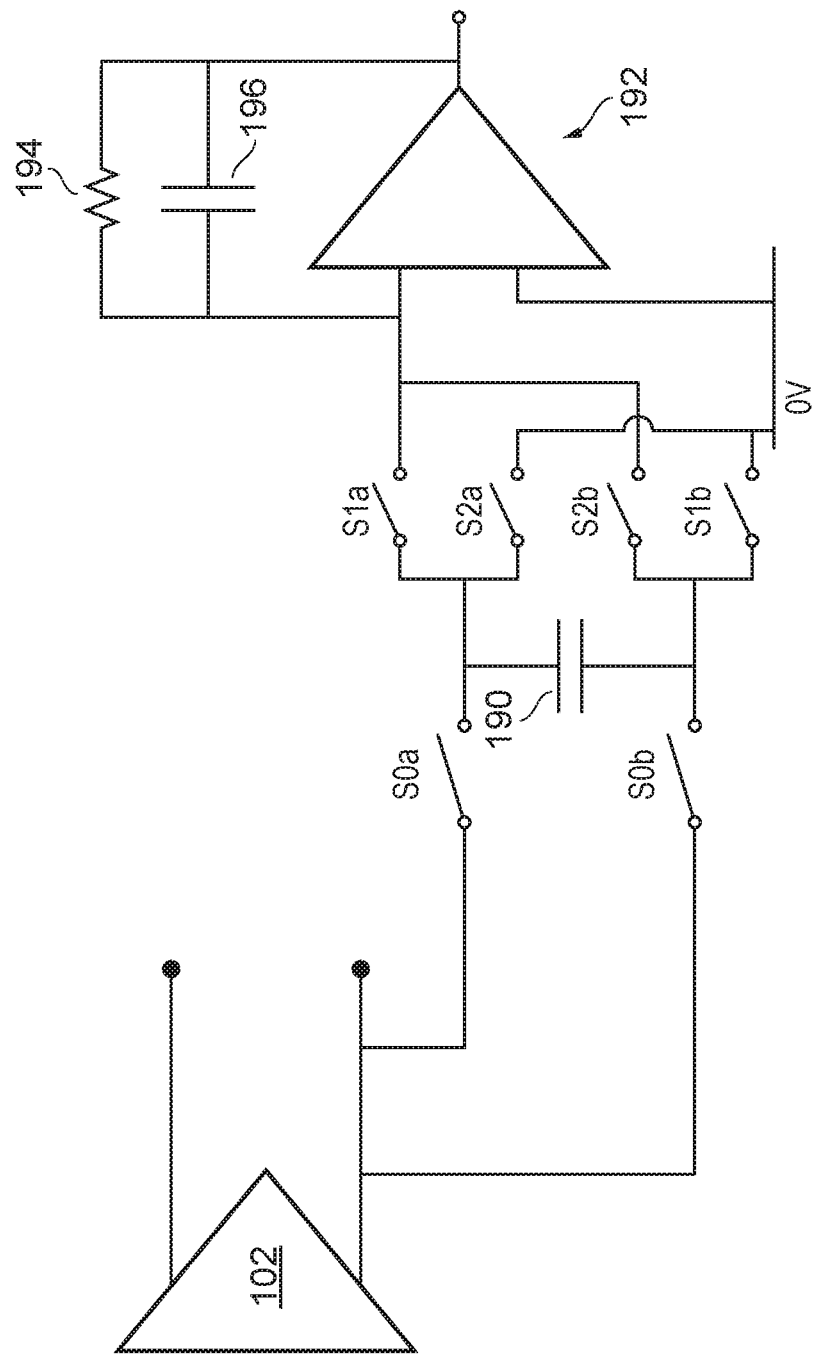
FIG. 8 schematically illustrates an analog embodiment of a processing unit for detecting an open circuit.

An embodiment of an analog implementation of the circuit 150 is shown in FIG. 8. The output of the amplifier can be provided to an integrator that acts to integrate the difference between the two outputs of the amplifier during the periods where the common mode control signal Vcm has a first value, Vcm1, and those periods where the common mode control signal has a second value Vcm2. The voltage Vcm can be switched between Vcm1 and Vcm2 in an alternating fashion. This integration can be performed by sampling the differential output signal from the amplifier 102 onto a capacitor 190, and then charge sharing the sampled charge with a leaky integrator 192, and where the switches associated with the capacitor 190 allow it to be swapped over such that the charge can be additive or subtractive with the result of the integrator. To do this the capacitor is associated with three pairs of switches. A first pair of switches S0a, S0b control the sampling of the differential output signal onto the capacitor 190. When the switches S0a and S0b are closed the output voltage of the amplifier 102 is sampled onto the capacitor 190. When they are opened the signal is held on the capacitor 190.

On the output side of the capacitor switches S1a and S1b can be closed to connect the capacitor 190 to the integrator 192 such that the charge of the capacitor is added to the integrator in an additive sense, Switches S2a and S2b can be closed so as to swap the plates of the capacitor 190 over such that it charge shares with the integrator 192 in a subtractive manner. By sampling and integrating over many cycles of Vcm being swapped between Vcm1 and Vcm2 the difference in the differential can be extracted and integrated, and if the output of the integrator 192 exceeds a threshold value this is indicative of an input becoming open circuit. The output of the integrator 192 may be fed to a comparator—such as a window comparator (not shown) to compare the output with a threshold value. The integrator 192 may be formed as a leaky integrator by placing a resistor 194 in parallel with the integration capacitor 196 so that amplifier offsets to not cause the integrator to overflow.

Figure 9:
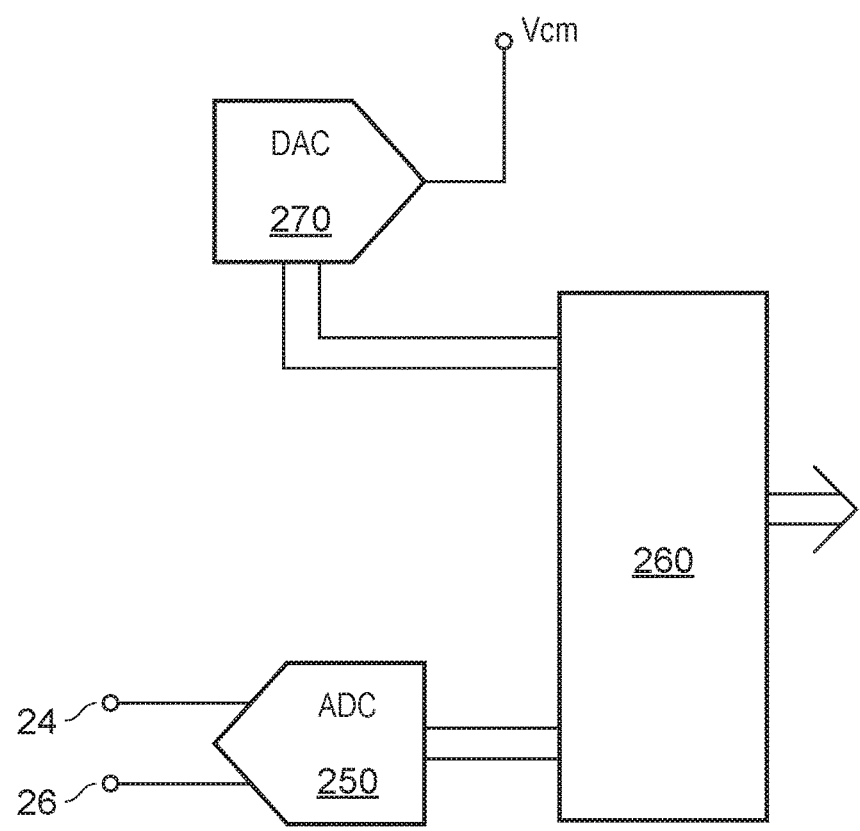
FIG. 9 schematically illustrates a digital embodiment of a processing unit for detecting an open circuit.

A similar functionality of looking at the differential signal with one common mode voltage and seeing how it changes when a second common mode voltage is selected could be performed in the digital domain, as illustrated in FIG. 9. Here a differential analog to digital converter 250 has its inputs connected to the output nodes 24 and 26 of the amplifier 102 and provides digital data to a digital processing block 260. A digital to analog converter 270 is also connected to a digital processing block and can be used to set and modulate the value $V_{cm}$.

Figure 10:
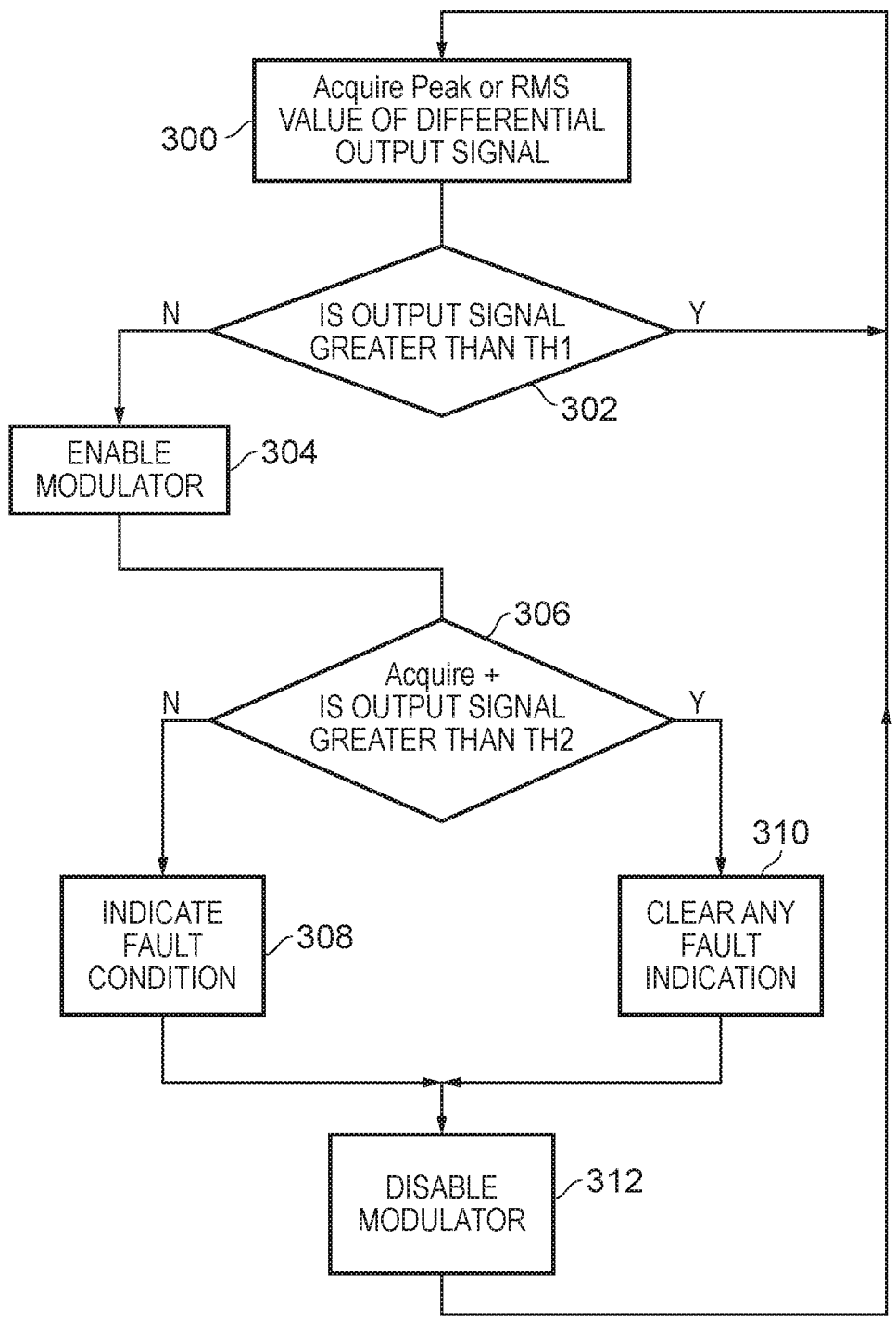
FIG. 10 shows a flow chart for open circuit detection.

FIG. 10 illustrates a flow chart of a process that may, in this example, be performed by the digital processor 260. The flow chart starts at step 300 where the output of the analog to digital converter 50 is analyzed in order to identify a peak, RMS or other meaningful representation of the value of the differential output signal. Processing then passes the step 302 where the value representative of the output signal is compared with a first threshold $TH_1$. If the value of the output signal is greater than $TH_1$ control then returns to step 300 as a signal representative of a current flowing has been output by the current transformer and burden resistor combination. Consequently the integrity of the input circuit 80 and connector 90 can be assumed to be good. If the output signal is less that the threshold then control passes to step 304 where common mode change is enabled and then to step 306 where the peak to peak value of the differential output signal with the modulator operative is acquired and then compared with the second threshold $TH_2$. If the output signal is greater than the value of $TH_2$, suggesting that the connection 90 has failed, then control passes to step 308 where a fault flag is set. However if the output signal is less than the value of $TH_2$ then control passes to step 310 where any preexisting fault flags are cleared. From step 308 or 310 control is then passed to step 312 where the common mode adjustment function is disabled. From there control is then returned to step 300 such that the monitoring process can continue.

The open circuit detector could be run only when a disconnect event is suspected, as set out in the flow chart of FIG. 10. However it could also be periodically, on demand, or permanently. In another approach the common mode may be modulated and the part of the differential signal attributable to that modulation extracted by various means whether through time domain or frequency domain analysis, and it can indicate an amount of imbalance in the system. Any change in this value can be indicative of a change in the source impedance and therefore be used to flag a fault condition. The perturbation in the output signal caused by running the disconnect detector is small and in many systems may be ignored. However, in some systems the magnitude of the perturbation may be estimated or learnt and removed from the output signal. This is most easily performed in the digital domain once the output of the difference amplifier has been converted by an analog to digital converter, however subtraction could also be performed in the analog domain if desired.

Figure 11:
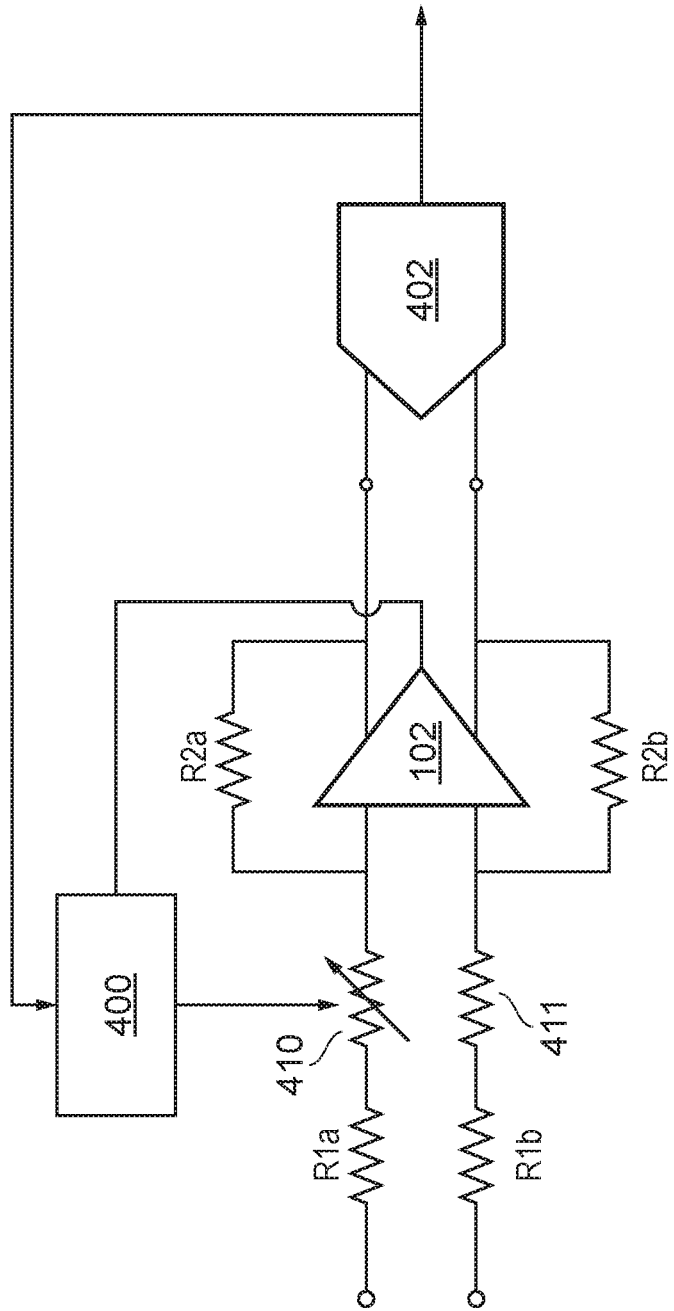
FIG. 11 shows an embodiment of a channel mismatch detector.

This approach described herein can also be extended to check the common mode rejection ratio of a differential circuit and to adjust it. FIG. 11 schematically illustrates an arrangement where a controller periodically modulates the target common mode voltage of an amplifier 102 and is arranged to monitor the differential outputs of the amplifier, either directly as disclosed hereinbefore or indirectly, for example by way of receiving an output of an analog to digital converter 402 which is provided to digitize the output of the amplifier for use by other circuits not shown. Furthermore the controller 400 may examine the conversion of the common mode voltage to a differential signal and on the basis of that conversion adjust an electrically adjustable resistance 410 so as to reduce mismatch between the channel responses. A matching resistance 411 is provided in the opposing input channel and has a value approximately equal to the mid-range value of the adjustable resistor 410.

Because it is possible to look for a correlation between the common mode gain and the modulation, the modulation can be formed of many possible signal types, such as a sinusoidal signal of known frequency; a square wave of known frequency; a slew rate limited square wave; a triangle wave; a digitally generated signal of arbitrary profile; a pseudo-random signal; or even noise.

It is thus possible to provide an apparatus for monitoring the differential response of a circuit and also to provide a disconnect detector which does not require adding further circuitry, such as current sources or impedances, to the input stage of the amplifier. The description has focused on circuits where the common mode output voltage is adjusted and this modifies the current flow in an input circuit. A similar approach can be used with circuits that allow the common mode input voltage to be set to a target value.

The teachings of this disclosure can be applied in a wide variety of uses, for example in industrial, automotive, aerospace and medical domains to make sure a connection is made between a transducer and a signal processing circuit, and/or to check for degradation of the transducer. It can also be used to monitor the common mode rejection performance of differential signal processing circuits (which have wide range of uses) and to adjust components to improve the common mode rejection performance of the circuit.

The claims presented herein are in single dependency format suitable for use at the USPTO. However it is to be understood that each and every claim is intended to be able to depend on any preceding claim of the same type provided that such dependency is not clearly technically impossible.

The invention claimed is:

1. A method of detecting channel imbalance in a circuit that comprises a differential signal processing circuit, the method comprises:
    applying a periodic voltage signal to common mode inputs of the differential signal processing circuit, the common mode inputs being distinct from signal input nodes of the differential signal processing circuit, wherein the periodic voltage signal is defined as a signal that cycles between two values over time; and
    monitoring a differential voltage received from outputs of the differential signal processing circuit for changes that are correlated with changes in the periodic voltage signal applied to the common mode inputs.

2. The method of claim 1, further comprising:
    computing value representing a change in voltage between first and second voltage values of the periodic voltage signal relative to a corresponding change in voltage between the differential voltage received from the outputs; and
    comparing the computed value to a threshold to detect the channel imbalance.

3. The method of claim 1, further comprising trimming or adjustment of components within the differential signal processing circuit to reduce the imbalance.

4. The method of claim 1, wherein the signal processing circuit comprises a difference amplifier and the outputs of the differential signal processing circuit are differential outputs of the difference amplifier.

5. The method of claim 2 further comprising integrating a difference between the differential voltage received from the outputs during a first period where the periodic voltage signal has the first voltage value and a second period where the periodic voltage signal has the second voltage value.

6. The method of claim 1, further comprising providing secondary paths to the common mode inputs, the secondary paths having deliberately different impedances, such that in the event of disconnection of a sensor from one or both input nodes of the differential signal processing circuit, secondary paths introduce a common mode gain.

7. The method of claim 1, wherein the periodic voltage signal includes at least one of
    a) a sinusoidal signal of known frequency;
    b) a square wave of known frequency;
    c) a slew rate limited square wave; or
    d) a triangle wave.

8. The method of claim 1, wherein the periodic voltage signal is applied to the differential signal processing circuit intermittently.

9. An apparatus for detecting channel imbalance in a differential signal processing system having a node for controlling a common mode value of a differential output signal, the apparatus comprising:
    common mode inputs of the differential signal processing system that receive a periodic voltage signal, the common mode inputs being distinct from signal input nodes of the differential signal processing system, wherein the periodic voltage signal is defined as a signal that cycles between two values over time; and
    a processor coupled to receive outputs of the differential signal processing system for examining a correlation between the received outputs of the differential signal processing system and the periodic voltage signal applied to the common mode inputs to identify channel imbalance.

10. The apparatus of claim 9, wherein the signal processing system comprises a difference amplifier, and the difference amplifier has a circuit responsive to a control node for controlling a common mode output voltage or common mode output current of the difference amplifier.

11. The method of claim 1, further comprising inducing a change in channel imbalance in response to a disconnection of an input arrangement, such that a disconnection of the input can be identified.

12. The apparatus of claim 9, further comprising a high value resistor coupled between the signal input nodes of the differential signal processing circuit.

13. The apparatus of claim 9, wherein the processor:
    computes value representing a change in voltage between first and second voltage values of the periodic voltage signal relative to a corresponding change in voltage between the differential voltage received from the outputs; and
    compares the computed value to a threshold to detect the channel imbalance.

14. The apparatus of claim 9, further comprising at least one adjustable component, wherein the component is adjustable in response to the identification of channel imbalance to reduce the imbalance.

15. The apparatus of claim 14, wherein the at least one component comprises an electrically adjustable resistance.

16. The apparatus of claim 9, wherein the apparatus is adapted to issue a signal to indicate when the imbalance exceeds a threshold.

17. The apparatus of claim 9, further including components to induce a change in channel imbalance in response to a disconnection of an input arrangement, such that a disconnection of the input can be identified.

18. An apparatus comprising:
    means for applying a periodic voltage signal to common mode inputs of a differential signal processing circuit, the common mode inputs being distinct from signal input nodes of the differential signal processing circuit, wherein the periodic voltage signal is defined as a signal that cycles between two values over time; and
    means for monitoring a differential voltage received from outputs of the differential signal processing circuit for changes that are correlated with changes in the periodic voltage signal applied to the common mode inputs.

19. The apparatus of claim 18, further comprising means for inducing a change in channel imbalance in response to a disconnection of an input arrangement, such that a disconnection of the input can be identified.

20. The apparatus of claim 18, further comprising:
    means for computing value representing a change in voltage between first and second voltage values of the periodic voltage signal relative to a corresponding change in voltage between the differential voltage received from the outputs; and
    means for comparing the computed value to a threshold to detect the channel imbalance.

* * * * *